(12) United States Patent
Bae et al.

(10) Patent No.: US 12,276,907 B2
(45) Date of Patent: Apr. 15, 2025

(54) PHOTORESIST INSPECTION APPARATUS, PHOTORESIST INSPECTION METHOD USING THE SAME, AND ELECTRON BEAM EXPOSURE APPARATUS

(71) Applicant: Samsung Electronics Co., Ltd., Suwon-si (KR)

(72) Inventors: Sukjong Bae, Seoul (KR); Johan Hofkens, Leuven (BE); Haifeng Yuan, Leuven (BE); Flip de Jong, Leuven (BE)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 558 days.

(21) Appl. No.: 17/679,749

(22) Filed: Feb. 24, 2022

(65) Prior Publication Data

US 2023/0042743 A1 Feb. 9, 2023

(30) Foreign Application Priority Data

Aug. 9, 2021 (KR) .................. 10 2021 0104898

(51) Int. Cl.
| | |
|---|---|
| G03F 7/20 | (2006.01) |
| G01N 21/64 | (2006.01) |
| G03F 1/86 | (2012.01) |
| G03F 7/00 | (2006.01) |
| G03F 7/22 | (2006.01) |
| G01N 21/956 | (2006.01) |

(52) U.S. Cl.
CPC ............ *G03F 1/86* (2013.01); *G01N 21/64* (2013.01); *G03F 7/2004* (2013.01); *G03F 7/70916* (2013.01); *G01N 2021/95676* (2013.01)

(58) Field of Classification Search
None
See application file for complete search history.

(56) References Cited

U.S. PATENT DOCUMENTS

| | | | |
|---|---|---|---|
| 5,059,808 A | * | 10/1991 | Tarui ............... G03F 9/7084 430/311 |
| 5,955,002 A | | 9/1999 | Neckers et al. |
| 6,376,149 B2 | | 4/2002 | Grober et al. |
| 6,379,149 B1 | | 4/2002 | Franetzki |
| 6,479,820 B1 | | 11/2002 | Singh et al. |
| 7,755,063 B2 | | 7/2010 | Baer |
| 9,921,487 B2 | | 3/2018 | Park et al. |
| 10,266,876 B2 | | 4/2019 | Cai et al. |

(Continued)

FOREIGN PATENT DOCUMENTS

| | | |
|---|---|---|
| CN | 107065436 B | 2/2020 |
| JP | 09257640 A * | 10/1997 |

(Continued)

OTHER PUBLICATIONS

Machine translation of CN 107065436 (Feb. 2020).*

*Primary Examiner* — Martin J Angebranndt
(74) *Attorney, Agent, or Firm* — Myers Bigel, P.A.

(57) ABSTRACT

According to example embodiments, there is provided a photoresist inspection method. The photoresist inspection method includes: providing a photoresist on a substrate; irradiating the photoresist with an electron beam and an excitation beam; detecting fluorescent light generated by the photoresist in response to the excitation beam; and evaluating the photoresist based on the fluorescent light.

13 Claims, 15 Drawing Sheets

(56) References Cited

U.S. PATENT DOCUMENTS

| | | | |
|---|---|---|---|
| 2002/0001768 A1* | 1/2002 | Feke | G03F 7/0045 |
| | | | 430/139 |
| 2004/0115563 A1* | 6/2004 | Rau | G03F 7/105 |
| | | | 252/301.36 |
| 2006/0028634 A1* | 2/2006 | Tuberfield | G03F 7/70675 |
| | | | 355/77 |
| 2010/0035189 A1* | 2/2010 | Watanabe | G03F 7/16 |
| | | | 430/320 |

FOREIGN PATENT DOCUMENTS

| | | | | |
|---|---|---|---|---|
| JP | 2002222748 A | | 8/2002 | |
| JP | 2011211197 A | * | 10/2011 | G03F 7/705 |
| JP | 5267824 B2 | | 8/2013 | |
| JP | 2014229845 A | * | 12/2014 | |
| JP | 2020056677 A | | 4/2020 | |
| WO | WO-2006103907 A1 | * | 10/2006 | C09K 11/06 |

* cited by examiner

PHOTORESIST INSPECTION APPARATUS, PHOTORESIST INSPECTION METHOD USING THE SAME, AND ELECTRON BEAM EXPOSURE APPARATUS

CROSS-REFERENCE TO RELATED APPLICATION

This application is based on and claims priority under 35 U.S.C. § 119 to Korean Patent Application No. 10-2021-0104898, filed on Aug. 9, 2021 in the Korean Intellectual Property Office, the disclosure of which is incorporated by reference herein in its entirety.

BACKGROUND

The inventive concept relates to an electronic beam exposure apparatus, a photoresist inspection method using the same, and a photoresist inspection apparatus.

Together with high integration of large scale integration (LSI), a line width of a circuit required for a semiconductor element has been gradually more miniaturized. To form a circuit pattern required by the semiconductor element, a method of reducing and transferring a high-precision mask (or a reticle) on a wafer by using an exposure apparatus of a reduced projection type is used. In this case, the high-precision mask is manufactured mainly by using electron beam lithography.

Exposure of an electron beam may be performed in an ultra-pressure environment or a vacuum environment, and outgassing of photoresist for the electron beam lithography, which occurs in the vacuum environment, may be a cause of polluting components of an electron beam optical system. Pollution of the components of the electron beam optical system may cause a beam drift phenomenon, in which an irradiation location of the electron beam is shifted.

SUMMARY

The inventive concept provides a photoresist inspection apparatus, a photoresist inspection method using the same, and an electronic beam exposure apparatus.

According to some embodiments, there is provided a photoresist inspection method. The photoresist inspection method includes: providing a photoresist on a substrate; irradiating the photoresist with an electronic bean and an excitation beam; detecting fluorescent light generated by the photoresist in response to the excitation beam; and evaluating the photoresist based on the fluorescent light.

According to some embodiments, there is provided a photoresist inspection apparatus. The photoresist inspection apparatus includes: an electronic beam optical system configured to irradiate a photoresist including fluorophores with an electron beam; and an inspection optical system configured to irradiate the photoresist with an excitation beam, and detect fluorescent light generated by the fluorophores in response to the excitation beam.

According to some embodiments, there is provided an electronic beam exposure apparatus. The electronic beam exposure apparatus includes: an electronic beam optical system configured to irradiate a photoresist including fluorophores with an electron beam; an excitation light source configured to irradiate an excitation beam to the photoresist; and a detector configured to detect fluorescent light generated by the fluorophores in response to the excitation beam, wherein the excitation light source and the detector constitute a slanted optical system, and the electron beam optical system includes a vertical optical system.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
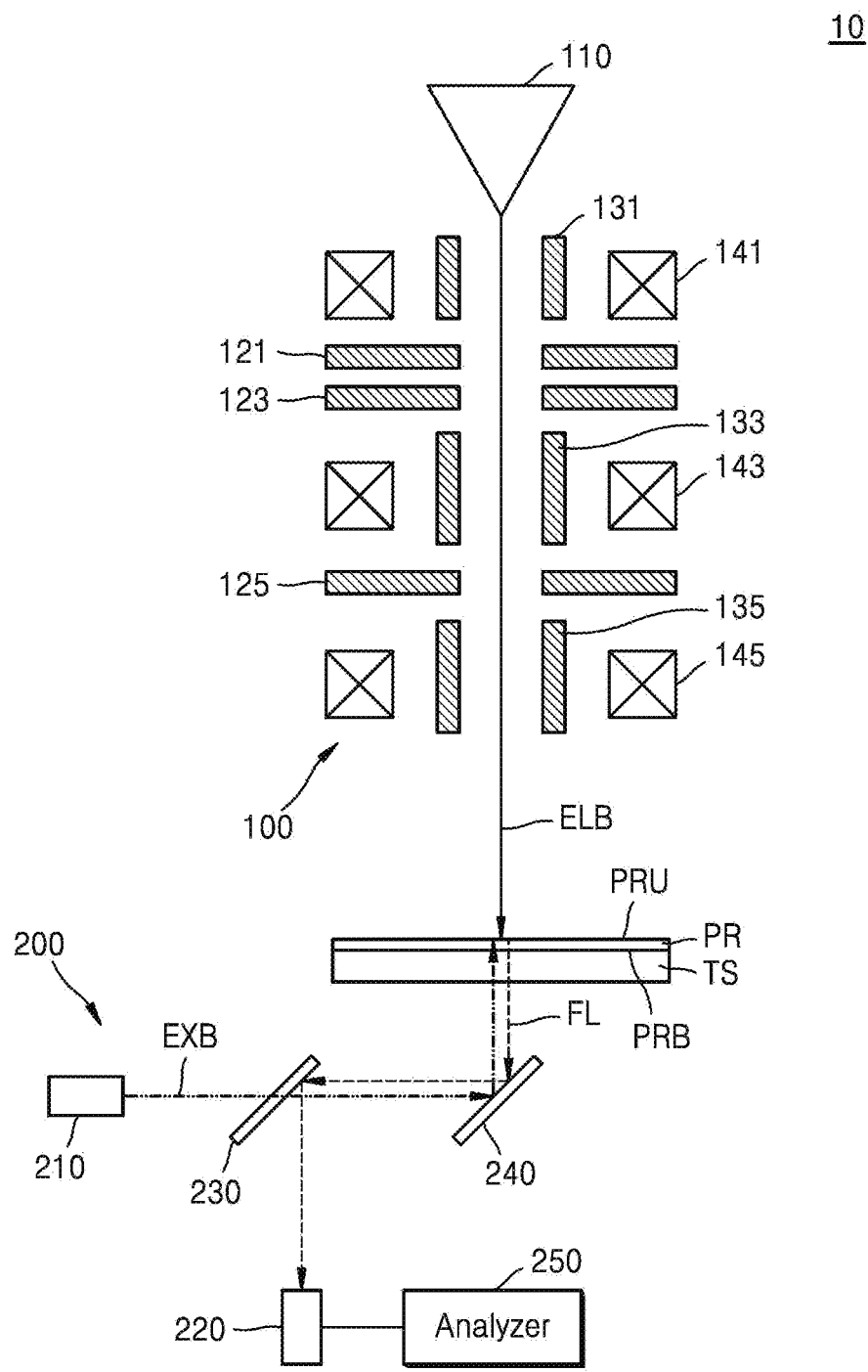
FIG. 1 is a schematic diagram of a photoresist inspection apparatus, according to an example embodiment.

Hereinafter, embodiments of the inventive concept are described in detail with reference to the accompanying drawings. Identical reference numerals are used for the same components in the drawings, and a duplicate description thereof will be omitted.

FIG. 1 is a schematic diagram of a photoresist inspection apparatus 10, according to an example embodiment.

The photoresist inspection apparatus 10 may include an electron beam optical system 100 configured to irradiate a photoresist PR with an electron beam ELB and an inspection optical system 200 configured to inspect the photoresist PR.

According to example embodiments, the photoresist inspection apparatus 10 may inspect the characteristics of the photoresist PR. The photoresist inspection apparatus 10 may be configured to quantitatively evaluate a response of the photoresist PR to the electron beam ELB. The photoresist inspection apparatus 10 may quantify movements of photosensitive particles in the photoresist PR, outgassing of the photoresist PR, etc.

The photoresist PR may be, for example, a positive type or a negative type. When the photoresist PR is a positive type, a portion of the photoresist PR exposed by the electron beam ELB may be removed by using a development process. When the photoresist PR is a negative type, a portion of the photoresist PR, which has not been exposed by the electron beam ELB, may be removed by using a development process. An example of a photoresist PR with a positive type may include poly-methyl methacrylate (PMMA) and poly-butene-1 sulfone (PBS). An example of a photoresist PR with a negative type may include poly-glycidyl methacrylate-co-ethyl-acrylate (COP).

The photoresist PR may include fluorophores. The fluorophores may be uniformly and homogeneously dispersed entirely throughout the photoresist PR. As an example, the fluorophores may be physically mixed with photosensitive particles constituting the photoresist PR, or may be chemically combined with (chemically bound to) the photosensitive particles constituting the photoresist PR.

In this case, the fluorophores may include a compound, which emits light when excited. The fluorophores may generally include aromatic groups or planar (or cyclic) molecules having π bonds. A non-limiting example of the fluorophores may include fluorescein isothiocyanate (FITC). According to a kind of the fluorophores, the inspection optical system 200 may also further include a laser apparatus configured to generate an activation beam and irradiate the photoresist to activate the fluorophores.

The photoresist PR may be on a transparent substrate TS. The photoresist PR may be provided on the transparent substrate TS by using various coating methods including a spin coating method. According to example embodiments, the transparent substrate TS may be transparent with respect to the excitation beam EXB generated by an excitation light source 210, and with respect to fluorescent light FL generated by the fluorophores of the photoresist PR in response to the excitation beam EXB.

The photoresist PR may be arranged on the transparent substrate TS in a form of a thin film. The photoresist PR may include a first surface PRU and a second surface PRB opposite to the first surface PRU. The second surface PRB of the photoresist PR may face the transparent substrate TS. The first surface PRU of the photoresist PR may also be referred to as an upper surface, and the second surface PRB of the photoresist PR may also be referred to as a lower surface.

As an example, the transparent substrate TS may be mounted on an inspection stage of the photoresist inspection apparatus 10. As another example, the transparent substrate TS may include the inspection stage of the photoresist inspection apparatus 10 on which the photoresist PR is applied.

The electron beam optical system 100 may include an electron gun 110, a blanking aperture 121, a first forming aperture 123, a second forming aperture 125, a first deflector 131, a second deflector 133, a third deflector 135, a lighting lens 141, a projection lens 143, and an object lens 145. The electron beam optical system 100 may be configured to irradiate the first surface PRU of the photoresist PR with the electron beam ELB.

The electron gun 110 may generate and emit the electron beam ELB.

The first deflector 131 may deflect the electron beam ELB emitted by the electron gun 110. For example, when the electron beam optical system 100 is in an "on" status, the first deflector 131 may deflect the electron beam ELB so that the electron beam ELB passes through the blanking aperture 121. For example, when the electron beam optical system 100 is in an "off" status, the first deflector 131 may deflect the electron beam ELB so that the electron beam ELB is blocked by the blanking aperture 121. While the electron beam optical system 100 is changed from an "off" status to an "on" status, and again to an "off" status, the electron beam ELB having passed through the blanking aperture 121 may be referred to as one "shot."

The electron beam ELB of each shot, which is generated by passing through the first deflector 131 and the blanking aperture 121, may be directed by the lighting lens 141 to the first forming aperture 123 having an opening of, for example, a rectangular shape.

The electron beam ELB having passed through the opening of the first forming aperture 123 may have a beam cross-section of a rectangular shape. The electron beam ELB formed by the first forming aperture 123 may be projected to the second forming aperture 125 by the projection lens 143.

The second deflector 133 may deflect the electron beam ELB, which has passed through the first forming aperture 123. According to example embodiments, a shape and a dimension of the electron beam ELB having passed through the opening of the second forming aperture 125 may be changed by adjusting deflection of the electron beam ELB with respect to the second forming aperture 125.

The electron beam ELB having passed through the second forming aperture 125 may be focused by the object lens 145, deflected by the third deflector 135 to irradiate the photoresist PR.

The inspection optical system 200 may include, for example, a bright-field optical microscope and a single molecule microscope using fluorescent light. The single molecule microscope may include a microscope based on a single molecule localization method. The single molecule localization method may include a technique for calculating a point spread function (PSF) representing a strength distribution of the fluorescent light emitted by the fluorophores, and determining locations of the fluorophores at a high precision by determining maximum points of the PSF as the locations of the fluorophores.

Because fluorescent microscopy selectively detects only a fluorescent beam generated by the fluorophores, the fluorescent microscopy may not be affected by peripheral patterns, for example, the roughness of the transparent substrate TS, or the like. Because the fluorescent microscopy is affected only by a quantum yield and a fluorophore density of a fluorescent material, the fluorescent microscopy may detect an inspection object at a high sensitivity, compared to general optical microscopy.

The inspection optical system 200 may irradiate the photoresist PR with the excitation beam EXB that is configured to excite the fluorophores in the photoresist PR. The inspection optical system 200 may detect the fluorescent light FL generated by the excitation fluorophores.

Accordingly, the inspection optical system 200 may determine locations of the fluorophores in the photoresist PR. The inspection optical system 200 may determine the locations of the fluorophores within an error range of several nanometers.

The inspection optical system 200 may be arranged apart from the electron beam optical system 100 with the photoresist PR therebetween. For example, the electron beam optical system 100 may face the first surface PRU of the photoresist PR, and the inspection optical system 200 may face the second surface PRB of the photoresist PR.

The inspection optical system 200 may include the excitation light source 210, a detector 220, a dichroic mirror 230, and a mirror 240. A configuration of the inspection optical system 200 including the dichroic mirror 230 and the mirror 240 may be an example, and in any sense, the embodiment is not limited thereto. The inspection optical system 200 may include an arbitrary optical component for irradiating the photoresist PR with the excitation beam EXB, and detecting the fluorescent light FL generated by the fluorophores of the photoresist PR.

According to example embodiments, the excitation light source 210 may include a laser apparatus configured to generate and emit the excitation beam EXB. The excitation beam EXB may penetrate the dichroic mirror 230, be reflected by the mirror 240, and reach the photoresist PR. The excitation beam EXB may have a wavelength of a band of an ultraviolet ray, a visible ray, or an infrared ray. As a non-limiting example, a wavelength of the excitation beam EXB may be about 488 nm.

The fluorophores of the photoresist PR may generate the fluorescent light FL corresponding to the excitation beam EXB (that is, by being excitation by the excitation beam EXB). A wavelength of the fluorescent light FL may be different from the wavelength of the excitation beam EXB. The wavelength of the fluorescent light FL may be greater than the wavelength of the excitation beam EXB. In FIG. 1, for convenience of description, only a portion of the fluorescent light FL emitted in a direction substantially perpendicular to an upper surface of the transparent substrate TS is illustrated, but the fluorescent light FL may be isotropically emitted from each of the fluorophores.

The fluorescent light FL may be reflected by the mirror 240, be reflected by the dichroic mirror 230, and reach the detector 220. The mirror 240 may have a high reflectivity with respect to a wavelength of each of the excitation beam EXB and the fluorescent light FL. The dichroic mirror 230 may have a low reflectivity (that is, a high transmittance) with respect to a wavelength of the excitation beam EXB, and may have a high reflectivity with respect to the wavelength of the fluorescent light FL.

The detector 220 may be configured to detect the fluorescent light FL. The detector 220 may be configured to determine a location of each of the fluorophores based on the fluorescent light FL. As described above, the detector 220 may be configured to generate an image of the photoresist PR, in which the location of each of the fluorophores is shown based on the fluorescent light FL. In other words, the detector 220 may be configured to generate electrical signals corresponding to the image of the photoresist PR, in which the location of each of the fluorophores is shown, based on the fluorescent light FL.

According to example embodiments, the photoresist inspection apparatus 10 may further include a controller configured to control each of the electron beam optical system 100 and the inspection optical system 200. The inspection optical system 200 may further include an analyzer 250 configured to is shown.

The controller may control oscillation of the electron gun 110, operations of first, second, and third deflectors 131, 133, and 135, oscillation of the excitation beam EXB, and an overall operation of the detector 220.

The analyzer 250 may determine a degree of outgassing of the photoresist PR, based on the image of the photoresist PR generated by the fluorescent light FL and changes (for example, density changes) of the fluorophores of the photoresist PR.

The analyzer 250 may trace a movement of individual fluorophores of the photoresist PR, and generate a vector map of the movement of each of particles in the photoresist PR. The analyzer 250 may generate a histogram of a magnitude of a movement distance of a particle, based on the vector map of the movement of each particle in the photoresist PR.

The controller and the analyzer 250 may include a computing apparatus such as a workstation computer, a desktop computer, a laptop computer, and a tablet computer. The controller and the analyzer 250 may be each configured as hardware, or as software included in hardware. The controller and the analyzer 250 may also include a simple controller, a microprocessor, a complex processor such as a central processing unit (CPU), and a graphics processing unit (GPU), a processor including software, dedicated hardware, or dedicated firmware. The controller and the analyzer 250 may be implemented by, for example, application specific hardware such as a digital signal processor (DSP), a field programmable gate array (FPGA), and an application specific integrated circuit (ASIC).

According to some embodiments, operations of the controller and the analyzer 250 may be implemented as commands stored in a machine-readable medium, which is read and executed by one or more processors. In this case, the machine-readable medium may include an arbitrary mechanism for storing and/or transmitting information in a form readable by a machine (for example, a computing device). For example, the machine-readable medium may include read-only memory (ROM), random access memory (RAM), magnetic disk storage media, optical storage media, flash memory apparatuses, electrical, optical, acoustical, or other different forms of, radio signals (for example, carrier waves, infrared signals, digital signals, or the like), and other arbitrary signals.

The controller and the analyzer 250 may include firmware, software, routines, commands for executing operations described for the controller and the analyzer 250, or for performing arbitrary processes to be described below. However, this is only for convenience of description, and it should be understood that the operations of the controller and the analyzer 250 described above may be executed by a computing apparatus, a processor, a controller, or other apparatuses executing firmware, software, routines, commands, etc.

Figure 2A:
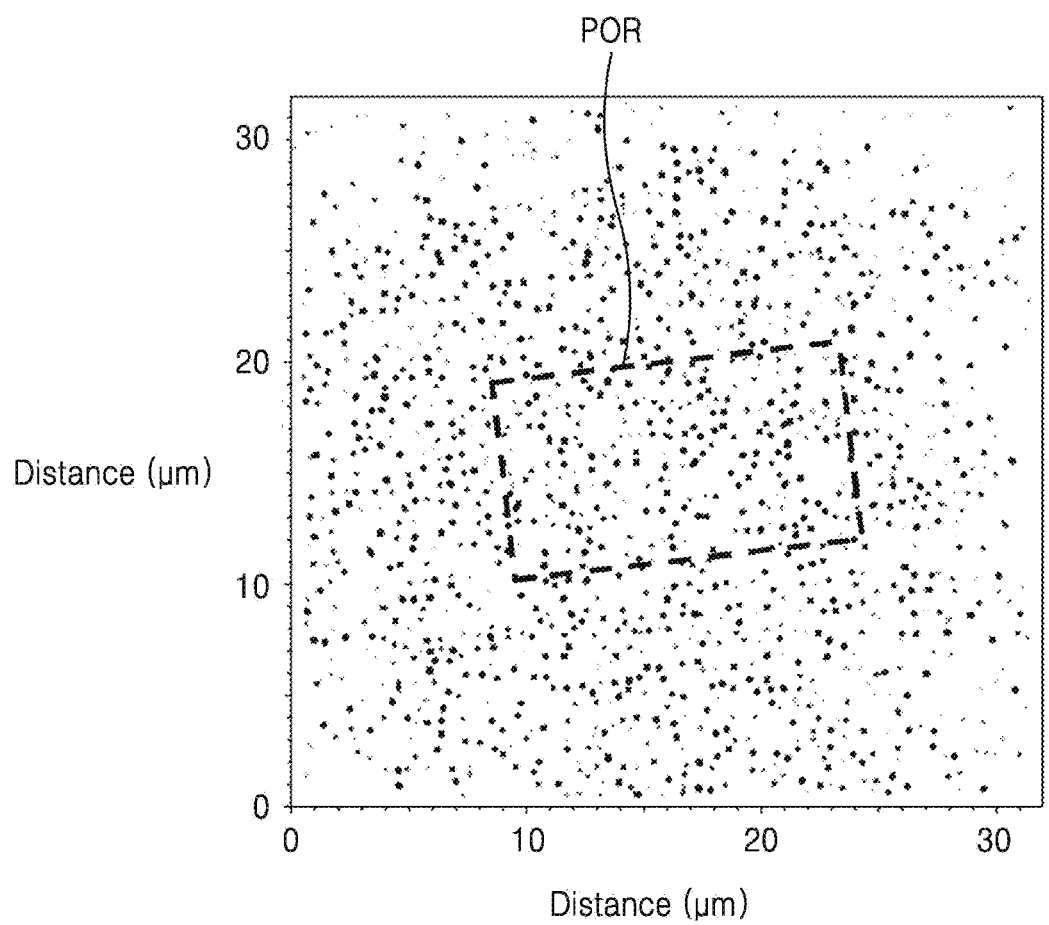
FIGS. 2A and 2B are images of a photoresist generated by a photoresist inspection apparatus, according to example embodiments.
Figure 2B:
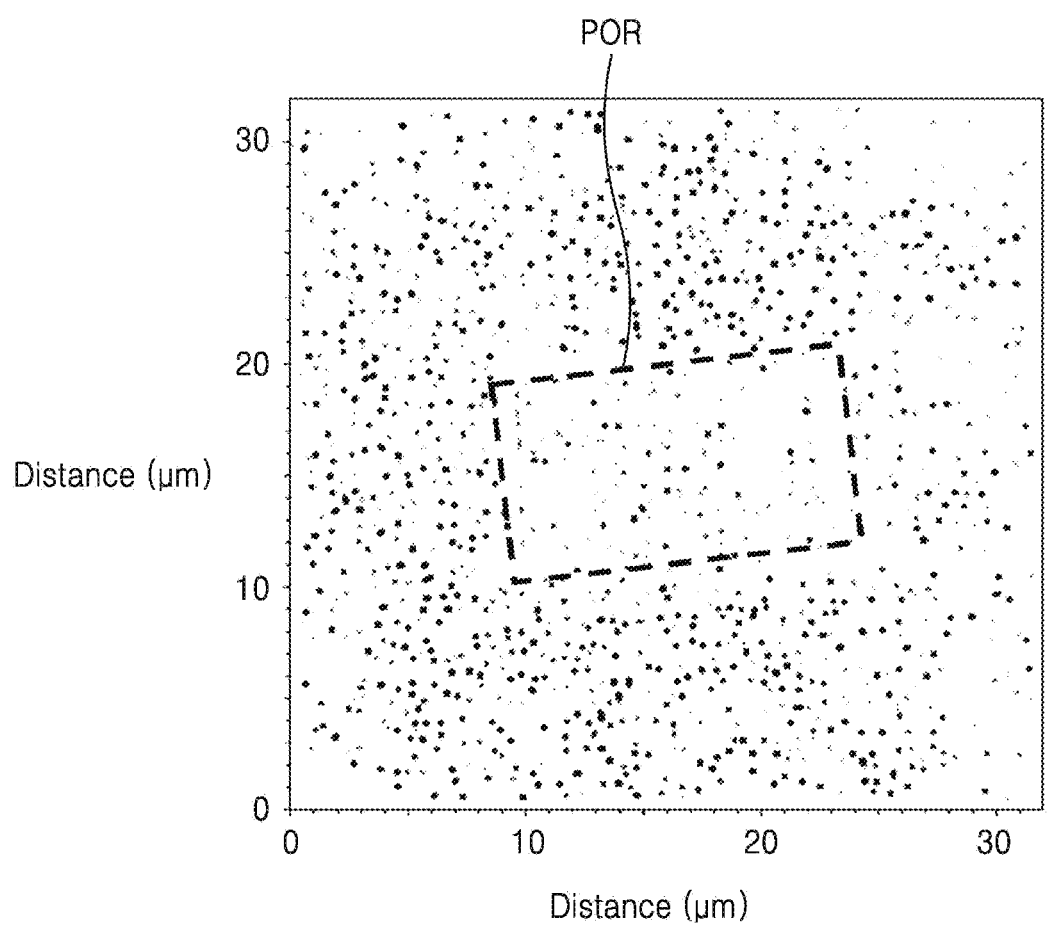

FIGS. 2A and 2B are images of the photoresist PR generated by the photoresist inspection apparatus 10, according to example embodiments. FIG. 2A is an image of the photoresist PR before a portion POR thereof is exposed by the electron beam ELB, and FIG. 2B is an image of the photoresist PR after the portion POR thereof is exposed by the electron beam ELB. In FIGS. 2A and 2B, points respectively represents the locations of the fluorophores.

Referring to FIGS. 1 through 2B, it is identified that the density of the fluorophores of the portion POR has been reduced, compared to that before the exposure, by the exposure of the electron beam ELB. The analyzer 250 of the photoresist inspection apparatus 10 may calculate a density change of each pixel of the fluorophores in the photoresist PR between before and after the exposure, by counting the number of fluorophores included in the image of the photoresist PR. The analyzer 250 of the photoresist inspection apparatus 10 may trace in real time a movement of each fluorophore included in the image of the analyzer 250.

Figure 3:
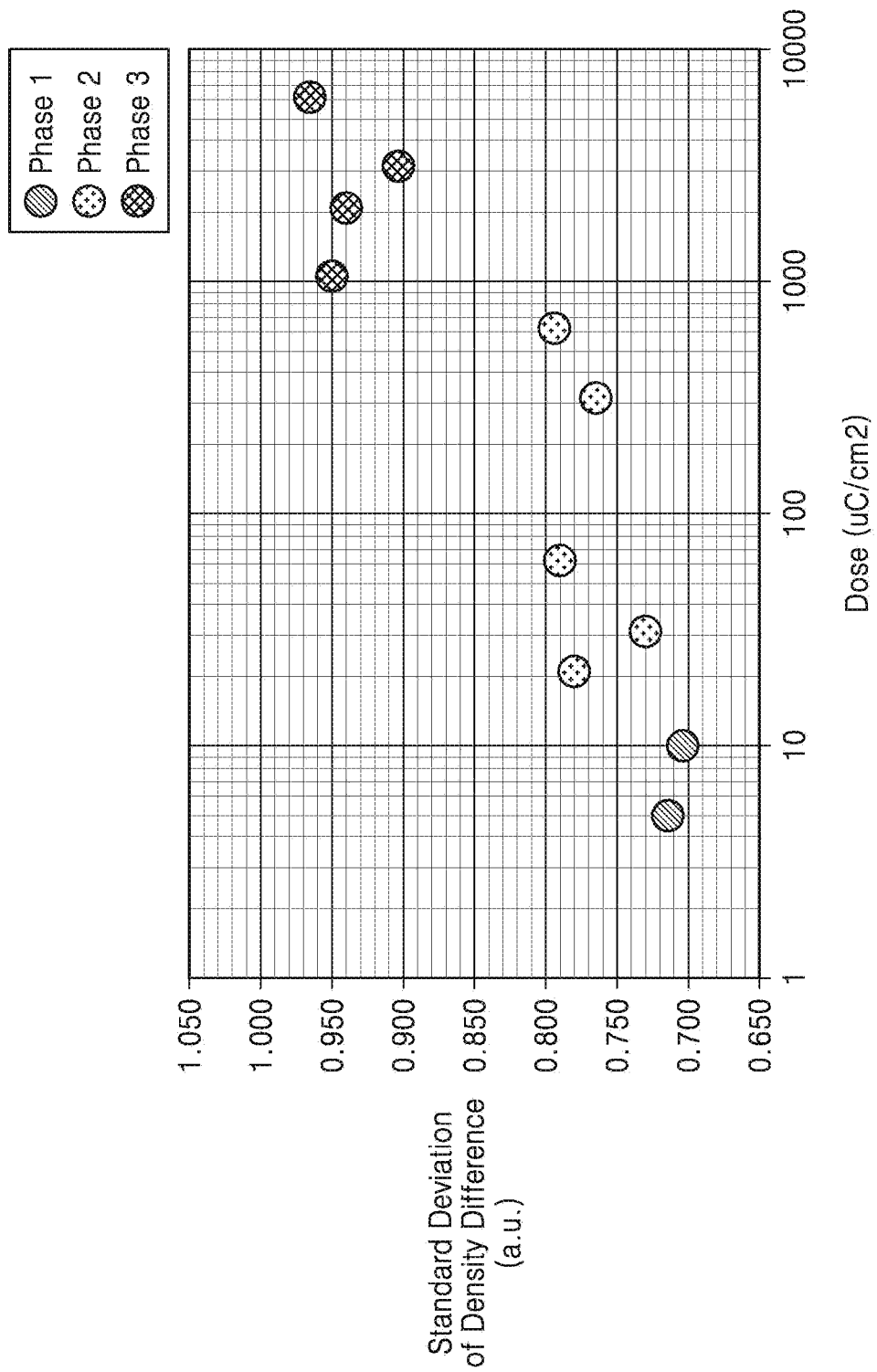
FIG. 3 is a graph for describing an operation of a photoresist inspection apparatus, according to an example embodiment.

FIG. 3 is a graph for describing an operation of the photoresist inspection apparatus 10, according to an example embodiment.

In FIG. 3, the horizontal axis may represent the intensity of the electron beam ELB in $\mu C/Cm^2$ units, and the vertical axis may represent a standard deviation of density differences of the fluorophores in each pixel of the image of the photoresist PR before and after the exposure to the electron beam ELB.

In FIG. 3, samples of the photoresist PR exposed by the electron beam ELB having an intensity equal to or less than about 10 $\mu C/Cm^2$ are classified as a first phase 1, samples of the photoresist PR exposed by the electron beam ELB having an intensity of about 10 $\mu C/Cm^2$ to about 1000 $\mu C/Cm^2$ are classified as a second phase 2, and samples of the photoresist PR exposed by the electron beam ELB having an intensity of about 1000 μC/Cm² to about 10000 μC/Cm² are classified as a third phase 3.

In FIG. 3, it is identified that there is a positive correlation between the intensity of the electron beam ELB and the standard deviation of the density differences of the fluorophores before and after the electron beam exposure.

FIGS. 4 through 6B are diagrams for describing an operation of the photoresist inspection apparatus 10, according to example embodiments.

Figure 4:
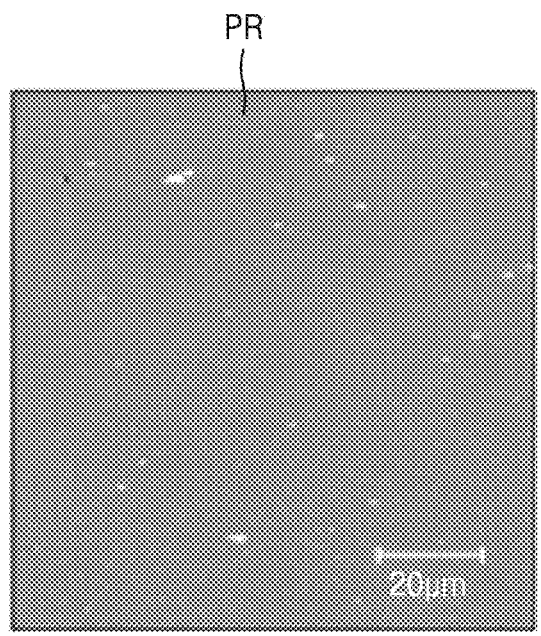
FIGS. 4 through 6B are diagrams for describing an operation of a photoresist inspection apparatus, according to example embodiments.
Figure 5A:
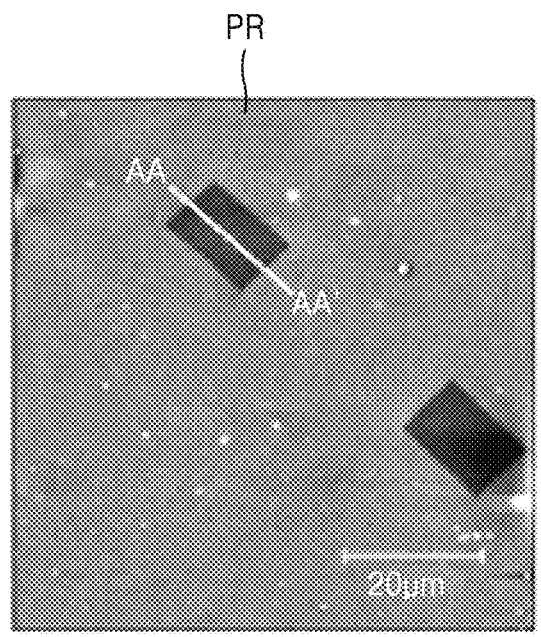
Figure 6A:
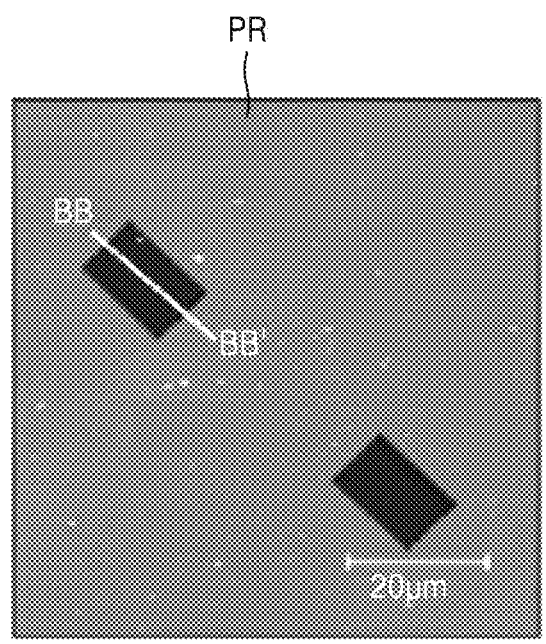

FIG. 4 illustrates an image of the photoresist PR exposed by the electron beam ELB having an intensity of about 10 μC/Cm², and the image may be classified as a sample of the first phase 1 described above. FIG. 5A illustrates an image of the photoresist PR exposed by the electron beam ELB having an intensity of about 630 μ/Cm², and the image may be classified as a sample of the second phase 2 described above. FIG. 6A illustrates an image of the photoresist PR exposed by the electron beam ELB having an intensity of about 10000 μC/Cm², and the image may be classified as a sample of the third phase 3 described above.

Figure 5B:
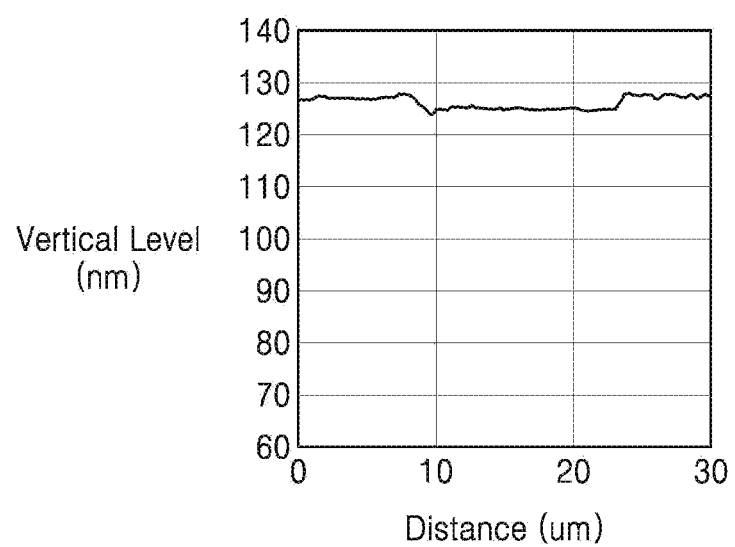
Figure 6B:
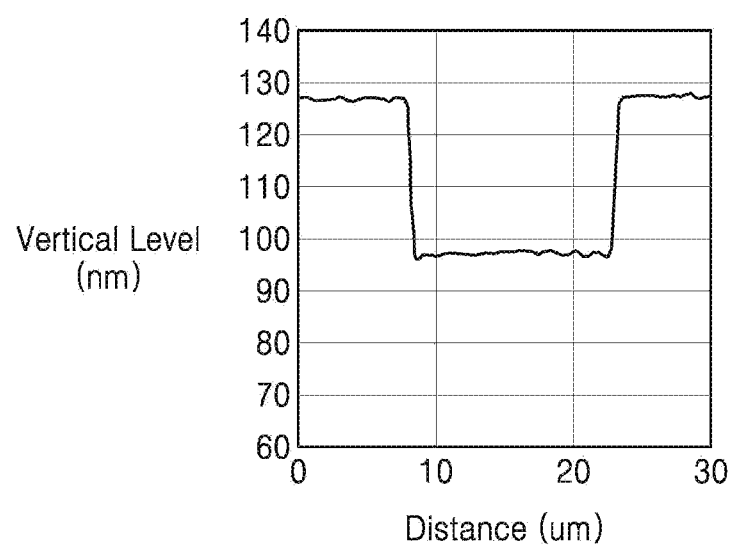

FIG. 5B illustrates a result of scanning the photoresist PR by using an atomic force microscope (AFM) along line AA-AA' in FIG. 5A, and FIG. 6B illustrates a result of scanning the photoresist PR by using the AFM along line BB-BB' in FIG. 6A.

Referring to FIG. 4, there is no change of a vertical level of the photoresist PR exposed by the electron beam ELB having an intensity of about 10 μC/Cm². In other words, the outgassing has not occurred in the photoresist PR exposed by the electron beam ELB having an intensity of about 10 μC/Cm².

Referring to FIGS. 5A and 5B, the vertical levels of portions of the photoresist PR exposed by the electron beam ELB having an intensity of about 630 μC/Cm² have been lowered by about 3 nm. In other words, the portions of the photoresist PR exposed by the electron beam ELB have been removed.

Referring to FIGS. 6A and 6B, the vertical levels of portions of the photoresist PR exposed by the electron beam ELB having an intensity of about 10000 μC/Cm² have been lowered by about 30 nm. In other words, the portions of the photoresist PR exposed by the electron beam ELB have been removed.

Figure 7:
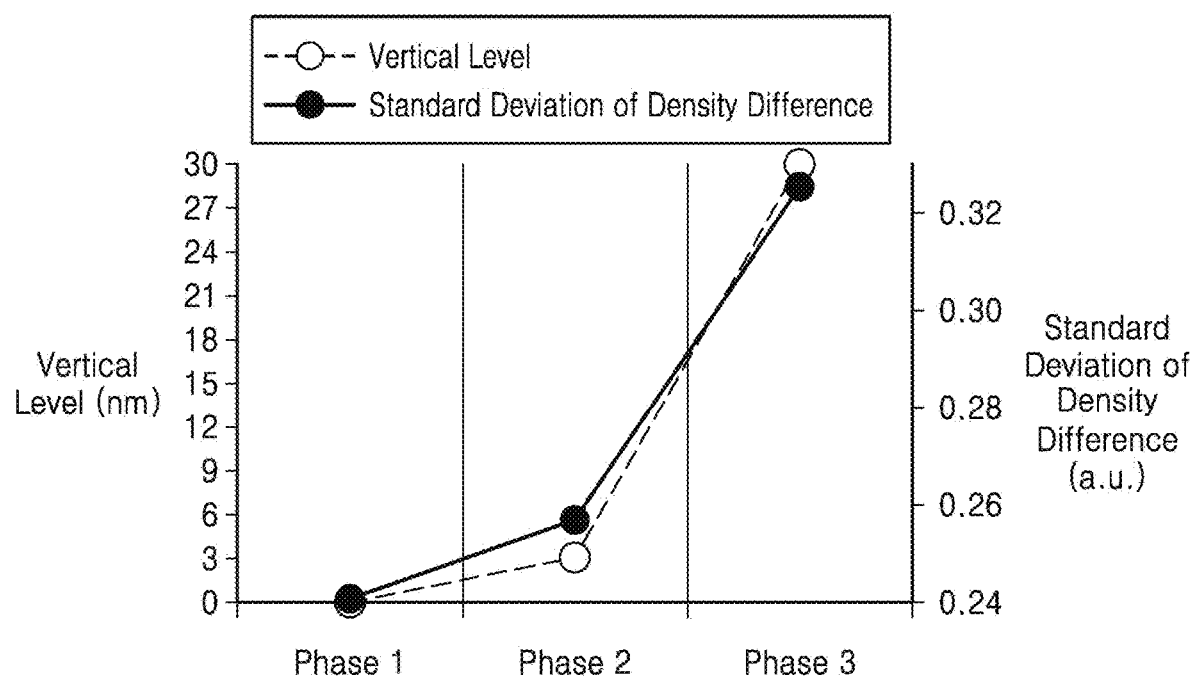
FIG. 7 is a graph for describing an operation of a photoresist inspection apparatus, according to an example embodiment.

FIG. 7 illustrates the standard deviation of density changes of the fluorophores of the samples of the first through third phases (phase 1 through 3) illustrated in FIG. 3 before and after the electron beam ELB exposure, and vertical level changes of the photoresist PR in response to the electron beam ELB exposure of the samples of the first through third phases (phase 1 through 3) illustrated in FIGS. 4 through 6B.

Referring to FIG. 7, it is verified that there is a high correlation (for example, a correlation coefficient close to about 1) between the standard deviation of density differences of the fluorophores and the vertical level change of the photoresist PR in response to the exposure before and after the exposure.

Referring to FIG. 1 again, the analyzer 250 of the photoresist inspection apparatus 10 may correlate the density differences of the fluorophores with the vertical level changes of the photoresist PR caused by the exposure of the electron beam ELB before and after the exposure.

Accordingly, the standard deviation of the density changes of the fluorophores in the photoresist PR in response to the electron beam ELB exposure may be measured in real time, and an amount of the photoresist PR removed by the outgassing may be quantitatively measured without measurement using an atomic microscope.

Recently, manufacturing of a mask for implementing an ultra-fine pattern (for example, a pattern having a critical dimension equal to or less than about 3 nm) on a wafer may be required, due to usage of extreme ultraviolet (EUV).

To manufacture the mask having an ultra-fine pattern, the resolution of the electron beam ELB may need to be improved, and accordingly, a high dose electron beam ELB exposure may be required. In this case, the high dose electron beam ELB exposure may cause contamination of the electron beam optical system 100 due to quality deterioration of the photoresist PR and the outgassing of the photoresist PR.

The contamination generated in the electron beam optical system 100 may amplify an electron beam drift phenomenon, and cause a mask image placement error. The mask image placement error may deteriorate an overlay indicating consistency between circuit layers vertically stacked in an integrated circuit, and accordingly, may reduce a yield and a process margin in semiconductor element manufacturing.

In the high dose electron beam ELB exposure, issues of the quality deterioration and the outgassing of the photoresist PR have been pointed out for a long time by the industry and the academia, but a method of measuring or quantitatively defining the robustness of the photoresist PR with respect to a high dose electron beam ELB condition has not yet been presented.

According to example embodiments, by inspecting the photoresist PR including the fluorophores by using the photoresist inspection apparatus 10, the robustness of the photoresist PR may be quantitatively measured under the high dose electron beam ELB condition.

In other words, by inspecting the fluorescent light FL generated by the fluorophores in the photoresist PR while the photoresist PR is exposed by using the electron beam optical system 100 at the same time, the behavior of the photoresist PR under the high dose electron beam ELB condition may be quantitatively measured without a discrete atomic force microscope (AFM).

Figure 8A:
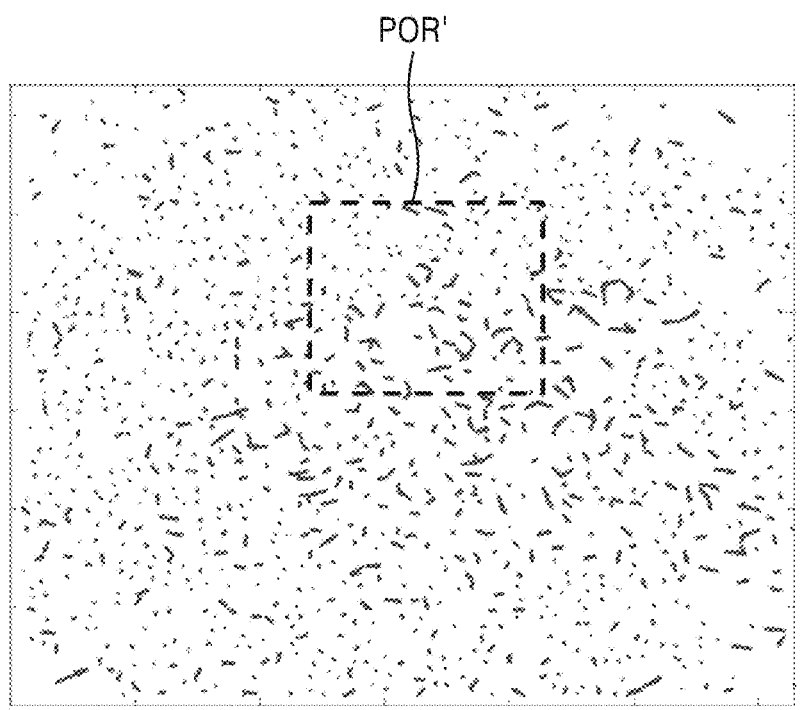
FIGS. 8A through 8C are diagrams for describing an operation of an electron beam optical system, according to example embodiments.
Figure 8B:
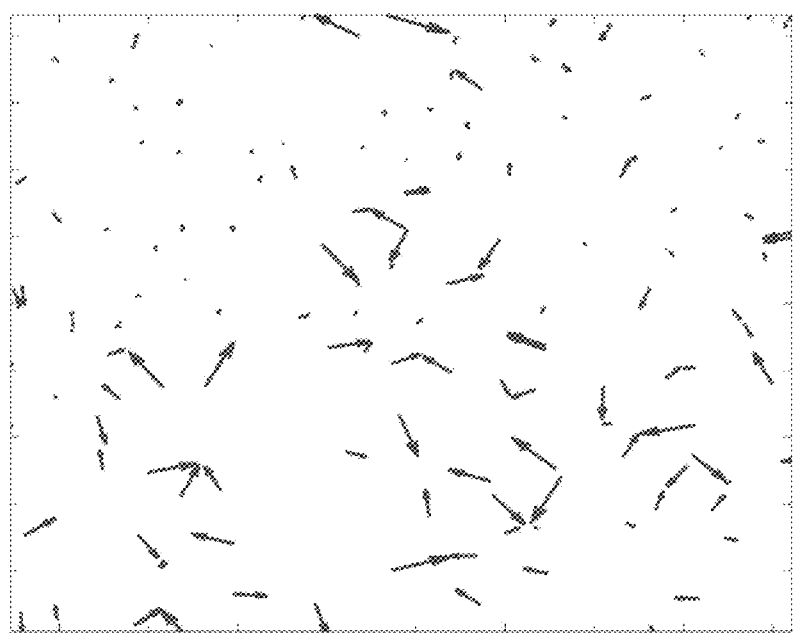
Figure 8C:
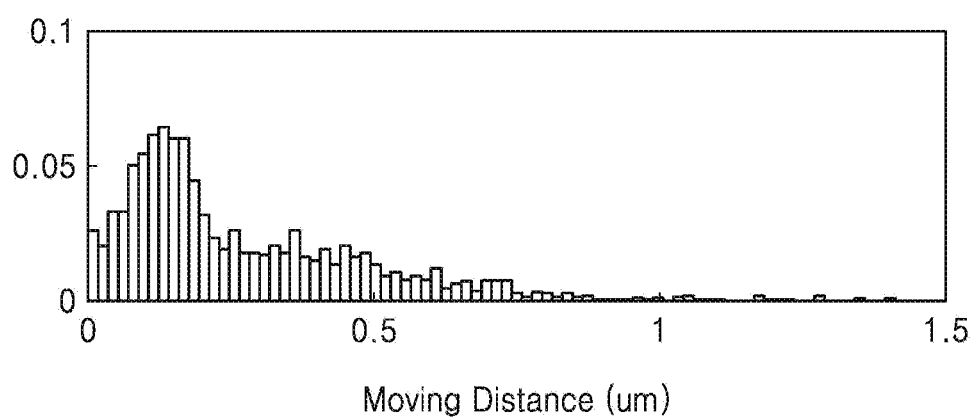

FIGS. 8A through 8C are diagrams for describing an operation of the electron beam optical system 100, according to example embodiments.

FIG. 8A is a vector map indicating movements of the fluorophores in response to the electron beam ELB exposure. FIG. 8B is an enlarged diagram of a region POR' in FIG. 8A, and FIG. 8C is a histogram generated based on a vector map illustrated in FIG. 8B.

Referring to FIGS. 1 and 8A through 8C, by detecting the fluorescent light FL generated by the fluorophores of the photoresist PR at certain time intervals while exposing the photoresist PR with the electron beam ELB at the same time, photoresist inspection apparatus 10 may generate a plurality of images indicating locations of the fluorophores in the photoresist PR.

By tracing in real time movements of the fluorophores from the plurality of images indicating the locations of the fluorophores, the electron beam optical system 100 may generate the vector maps illustrated in FIGS. 8A and 8B. In this case, arrows in FIGS. 8A and 8B may indicate the movements of the fluorophores.

A movement distance of each fluorophore may be calculated from the vector maps in FIGS. 8A and 8B, and the histogram of FIG. 8C may be generated based on the movement distance of each fluorophore. From the histogram of FIG. 8C, statistical values (for example, an average value, a median value, a standard deviation, or the like) for the movement distances of the fluorophores may be obtained, and accordingly, a quantitative evaluation of the characteristics (for example, robustness) of the photoresist PR may be performed.

Figure 9:
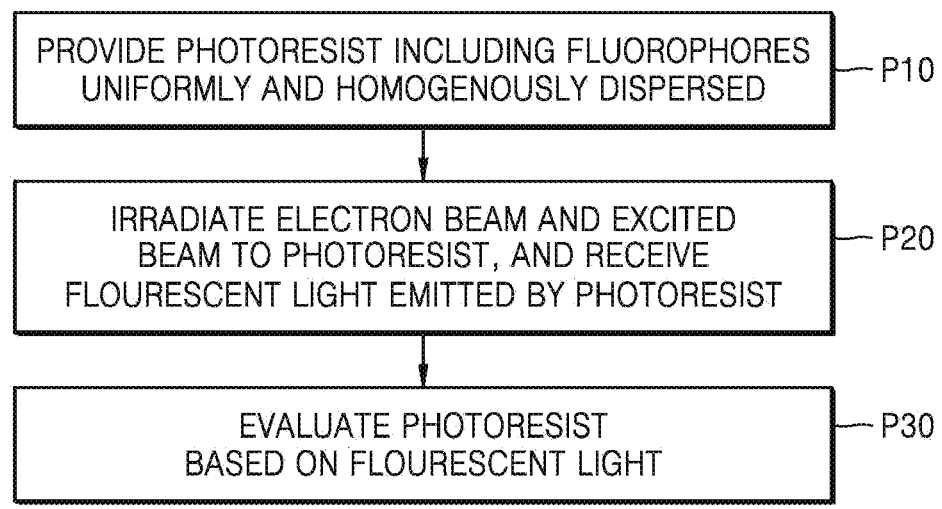
FIG. 9 is a flowchart of a photoresist inspection method, according to an example embodiment.

FIG. 9 is a flowchart of a photoresist inspection method, according to an example embodiment.

Referring to FIGS. 1 and 9, an inspection of the photoresist PR may include: providing the photoresist PR including the fluorophores, which are uniformly and homogeneously dispersed therein (P10); irradiating the photoresist PR with the electron beam ELB and the excitation beam EXB and receiving the fluorescent light FL emitted by the photoresist PR (P20); and evaluating the photoresist PR based on the fluorescent light FL (P30).

Operation P10 may include providing the fluorophores to a photoresist material so that the fluorophores are uniformly and homogeneously dispersed on a photoresist material. In this case, the fluorophores may constitute a physical mixture with particles constituting the photoresist material, or may be chemically combined with particles constituting the photoresist material.

Next, the photoresist material including the uniformly and homogeneously dispersed fluorophores may be applied on the transparent substrate TS to form the photoresist PR. Accordingly, the photoresist PR including the uniformly and homogeneously dispersed fluorophores may be provided.

In operation P20, the photoresists PR may be irradiated with the electron beam ELB and the excitation beam EXB at the same time during at least a certain time interval. The photoresist PR may be irradiated with the excitation beam EXB from the time when the electron beam ELB is in an "off" status. The photoresist PR may be irradiated with the excitation beam EXB even after the time point at which the electron beam ELB is changed to an "on" status. Accordingly, by receiving the fluorescent light FL before and after the electron beam ELB exposure, the inspection optical system 200 may measure changes of the fluorophores in the photoresist PR before and after the electron beam ELB exposure.

A physical measurement in operation P20 for the quantitative evaluation of the photoresist PR may be performed in real time, without moving the transparent substrate TS, to which the photoresist PR is applied, between different apparatuses from each other. Accordingly, the inspection of the photoresist PR according to example embodiments may be performed at a low cost and with a small amount of time.

In operation P30, the image of the photoresist PR, in which locations of the fluorophores are indicated, may be generated based on the fluorescent light FL. According to example embodiments, the inspection optical system 200 may calculate the standard deviation of density changes of the fluorophores of the photoresist PR before and after the electron beam ELB exposure, from the image of the photoresist PR, in which the locations of the fluorophores are indicated. Accordingly, a height change due to the outgassing of the photoresist PR in response to the electron beam ELB exposure may be measured, and the characteristics (for example, robustness) of the photoresist PR may be quantified.

According to other example embodiments, the inspection optical system 200 may generate the vector map indicating the movements of the fluorophores according to the electron beam ELB exposure from the image of the photoresist PR, in which the locations of the fluorophores are indicated. According to example embodiments, a histogram according to the movement distances of the fluorophores may be generated from the vector maps, and the characteristics of the photoresist PR (for example, the mobility of particles in the photoresist PR) may be quantitatively evaluated based on the histogram.

Figure 10:
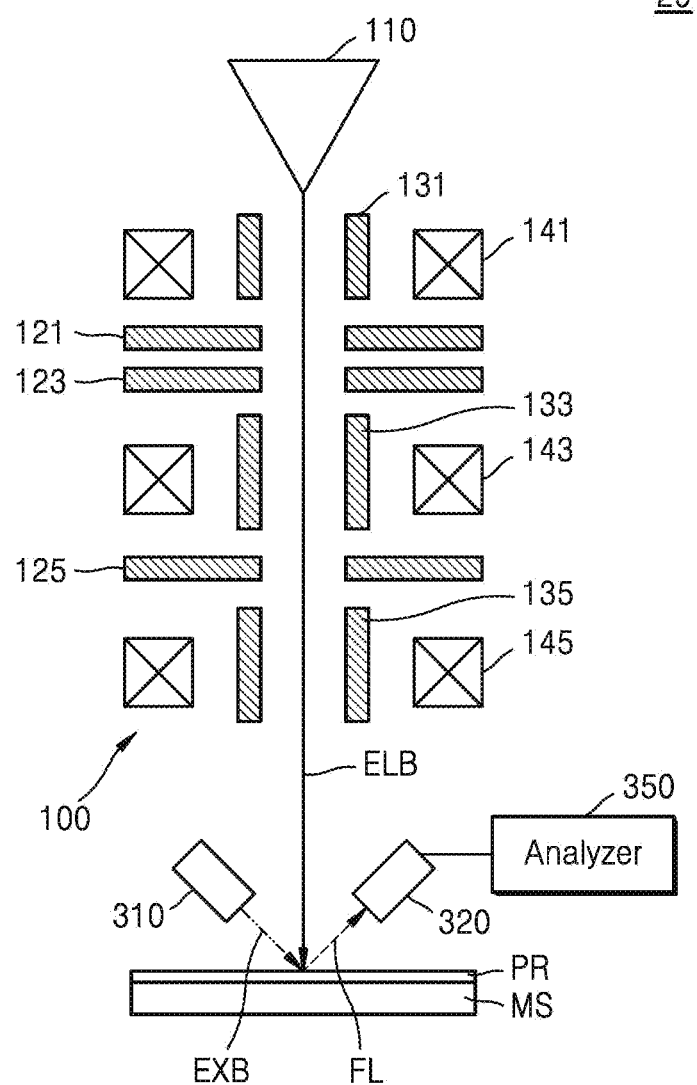
FIG. 10 is a schematic diagram of an electronic beam exposure apparatus, according to another example embodiment.

FIG. 10 is a diagram of an electronic beam exposure apparatus 20, according to another example embodiment.

Referring to FIG. 10, the electronic beam exposure apparatus 20 may include the electron beam optical system 100, an excitation light source 310, a detector 320, and an analyzer 350. According to example embodiments, the electronic beam exposure apparatus 20 may include, for example, an EUV mask manufacturing apparatus.

According to example embodiments, the electron beam optical system 100 may expose the photoresist PR formed on a mask substrate MS by using the electron beam ELB. The electron beam optical system 100 may expose the mask substrate MS based on mask data. Because descriptions of the electron beam optical system 100 is substantially the same as those given with reference to FIG. 1, duplicate descriptions thereof are omitted.

According to some embodiments, a process of converting the mask data into pixel data, before the electron beam ELB exposure process. The pixel data may include data that is directly used for actual exposure, and may include data of a feature of an object to be exposed and data of a dose allocated to each feature.

According to example embodiments, the excitation light source 310 and the detector 320 may constitute an oblique optical system. The excitation light source 310 may irradiate the photoresist PR with the excitation beam EXB in a slanted direction with respect to an upper surface of the photoresist PR. The detector 320 may detect the fluorescent light FL generated by the fluorophores of the photoresist PR in response to the excitation beam EXB.

According to example embodiments, the excitation light source 310 and the detector 320 may inspect the photoresist PR in-situ inside an electron beam exposure chamber. While the electron beam ELB exposure is performed by the electron beam optical system 100, the excitation light source 310 and the detector 320 may inspect the photoresist PR in real time. An operation of the analyzer 350 and a configuration of the analyzer 350 related with evaluation of the photoresist PR may be generally similar to those described with reference to FIG. 1.

According to example embodiments, by detecting the fluorescent light FL generated by the fluorophores in the photoresist PR while the electron beam ELB exposure is performed, the status of the photoresist PR may be inspected in real time. Accordingly, contamination or the like of the electron beam optical system 100 due to the outgassing may be monitored in real time, and the reliability of the EUV mask manufacturing may be improved.

After the electron beam ELB exposure is performed, the EUV mask may be formed by performing subsequent processes. The subsequent processes may include processes of, for example, development, etching, cleaning, etc. According to some embodiments, the subsequent processes for forming the EUV mask may include a measurement process, a defect inspection process, or a defect repair process. According to some embodiments, the subsequent processes for forming the EUV mask may include a pellicle coating process. The pellicle coating process may be performed after it is identified by using a final cleaning and inspection that there is no contamination particle or chemical stain on a surface of the EUV mask. The EUV mask may be protected from contamination, impact, or the like during the delivery and available life period of the EUV mask by the pellicle.

While the inventive concept has been particularly shown and described with reference to embodiments thereof, it will be understood that various changes in form and details may be made therein without departing from the spirit and scope of the following claims.

What is claimed is:

1. A photoresist inspection method comprising:
providing a photoresist on a substrate;
irradiating the photoresist comprising a plurality of fluorophores with an electron beam and an excitation beam;
detecting a fluorescent light generated by the photoresist in response to the excitation beam; and
evaluating the photoresist based on the fluorescent light, wherein the evaluating of the photoresist comprises generating a histogram of magnitudes of distance movement of the fluorophores based on a vector map indicating movements of the plurality of fluorophores in the photoresist due to exposure of the electron beam.

2. The photoresist inspection method of claim 1, wherein the evaluating of the photoresist comprises quantitatively evaluating characteristics of the photoresist.

3. The photoresist inspection method of claim 1, wherein the photoresist is irradiated by the excitation beam before the photoresist is irradiated by the electron beam and after the photoresist irradiated by the electron beam.

4. The photoresist inspection method of claim 1, wherein the providing of the photoresist on the substrate comprises:
providing the plurality of fluorophores to a photoresist material so that the plurality of fluorophores are uniformly and homogeneously dispersed in the photoresist material; and
applying the photoresist material, in which the plurality of fluorophores are uniformly and homogeneously dispersed, on the substrate so that the photoresist is on the substrate.

5. The photoresist inspection method of claim 4, wherein the plurality of fluorophores are physically mixed with the photoresist or chemically combined with the photoresist.

6. The photoresist inspection method of claim 4, wherein detecting the fluorescent light generated by the photoresist in response to the excitation beam comprises generating an electrical signal corresponding to an image of the photoresist comprising locations the plurality of fluorophores based on the fluorescent light.

7. The photoresist inspection method of claim 6, wherein the evaluating the photoresist based on the fluorescent light comprises evaluating the photoresist based on the electrical signal generated by a detector.

8. The photoresist inspection method of claim 4, wherein the electron beam is generated by an electron beam optical system, the excitation light is generated by an excitation light source, and fluorescent light is detected by a detector, and wherein the excitation light source and the detector comprise an oblique optical system and the electron beam optical system comprises a vertical optical system.

9. The photoresist inspection method of claim 1, wherein the plurality of fluorophores are configured to generate the fluorescent light in response to the excitation beam.

10. The photoresist inspection method of claim 9, wherein detecting the fluorescent light comprises detecting fluorescent light generated by the plurality of fluorophores of the photoresist repeatedly at time intervals while simultaneously irradiating the photoresist with the excitation beam, the excitation beam comprising an electron beam, and wherein the evaluating of the photoresist comprises generating a plurality of images of the photoresist comprising locations of the plurality of fluorophores generated based on the fluorescent light detected at the time intervals.

11. The photoresist inspection method of claim 9, wherein the evaluating of the photoresist is further performed based on a standard deviation of density changes of the plurality of fluorophores in the photoresist before and after exposure of the electron beam.

12. The photoresist inspection method of claim 9, wherein the evaluating of the photoresist further comprises calculating a vertical level change of the photoresist due to the electron beam based on a standard deviation of density changes of the plurality of fluorophores in the photoresist before and after exposure of the electron beam.

13. The photoresist inspection method of claim 1, wherein the electron beam is generated by an electron beam optical system, the method further comprising monitoring contamination of an electron beam optical system based on the fluorescent light.

* * * * *